United States Patent [19]

Morales

[11] Patent Number: 4,899,071
[45] Date of Patent: Feb. 6, 1990

[54] ACTIVE DELAY LINE CIRCUIT

[75] Inventor: Lou Morales, South Setauket, N.Y.

[73] Assignee: Standard Microsystems Corporation, Hauppauge, N.Y.

[21] Appl. No.: 227,731

[22] Filed: Aug. 2, 1988

[51] Int. Cl.[4] .................. H03K 5/159; H03K 5/13
[52] U.S. Cl. .................... 307/605; 307/481; 307/479; 307/602; 307/590; 328/55
[58] Field of Search ............ 307/605, 606, 602–603, 307/451–452, 585, 594, 279, 590, 480, 481, 479, 262, 511; 328/55, 155

[56] References Cited

U.S. PATENT DOCUMENTS

| | | | |
|---|---|---|---|
| 3,737,673 | 6/1973 | Suzuki | 307/452 |
| 3,855,549 | 12/1974 | Huener et al. | 307/451 |
| 3,914,702 | 10/1975 | Gehweiler | 307/451 |
| 4,532,439 | 7/1985 | Koike | 307/450 |
| 4,700,089 | 10/1987 | Fujii et al. | 307/605 |
| 4,771,196 | 9/1988 | Mead et al. | 307/605 |
| 4,837,466 | 6/1989 | Kanauchi | 307/605 |

FOREIGN PATENT DOCUMENTS 0171022 2/1986 European Pat. Off. ............ 307/605
0215134 12/1983 Japan ................................. 307/279

Primary Examiner—Stanley D. Miller
Assistant Examiner—Nancy Thai
Attorney, Agent, or Firm—Hopgood, Calimafde, Kalil, Blaustein & Judlowe

[57] ABSTRACT

A digital delay circuit that can be readily implemented in an integrated circuit is disclosed. The circuit includes a reference clock and two or more arrays of controlled delay elements. The reference clock is passed through one array of delay elements and the thus-delayed clock is compared to an undelayed clock in a phase detector or comparator the output of which is a control voltage. The latter is applied to the control inputs of each of the delay elements. The controlled delay elements may be in the form of buffers in which the delay is variable and controlled by the level of the control input.

4 Claims, 3 Drawing Sheets

ACTIVE DELAY LINE CIRCUIT

BACKGROUND OF THE INVENTION

The present invention relates generally to integrated circuits, and more particularly to a digital delay circuit capable of being implemented in an integrated circuit.

Delay lines are commonly used in a wide variety of electronic circuits, such as tuning circuits, that are sensitive to specific delays. The function of a delay line in these circuits is to delay an input digital signal by a specific predetermined amount of time. For example, hard disc data separators typically employ delay lines composed of precision LC networks and buffers to produce delays of 30 ns, 40 ns, and 50 ns.

The major drawback of the presently available digital delay lines is their requirement for precision components and inductors, which are relatively expensive and subject to variations in temperature and voltage. Moreover, it is not practical to incorporate these conventional delay lines into an integrated circuit irrespective of the technology used to fabricate the circuit.

SUMMARY OF THE INVENTION

It is accordingly an object of the invention to provide a precise delay element that does not require the use of precision components and inductances.

It is a further object of the invention to provide a precise digital delay element, which is self-compensating for temperature and voltage variations.

It is a further object of the invention to provide a precise digital delay element that can be readily incorporated into an integrated circuit.

It is yet another object of the invention to provide an active delay line that can be incorporated into an integrated circuit thereby eliminating pins on the device, as well as the need for an external active delay line.

To these ends, the circuit includes a reference clock and two arrays of M and N controlled delay elements. The reference clock is passed through one array of delay elements and the thus-delayed clock is compared to an undelayed clock in a phase detector or comparator the output of which is a control voltage. The latter is applied to the control inputs of each of the delay elements. The controlled delay elements may be in the form of buffers in which the delay is variable and controlled by a control input.

BRIEF DESCRIPTION OF THE DRAWINGS

To the accomplishment of the above and such further objects as may hereinafter appear, the present invention relates to a digital delay line substantially as defined in the appended claims and as described in the following specification considered with the accompanying drawings in which:

DESCRIPTION OF THE PREFERRED EMBODIMENTS

Figure 1:
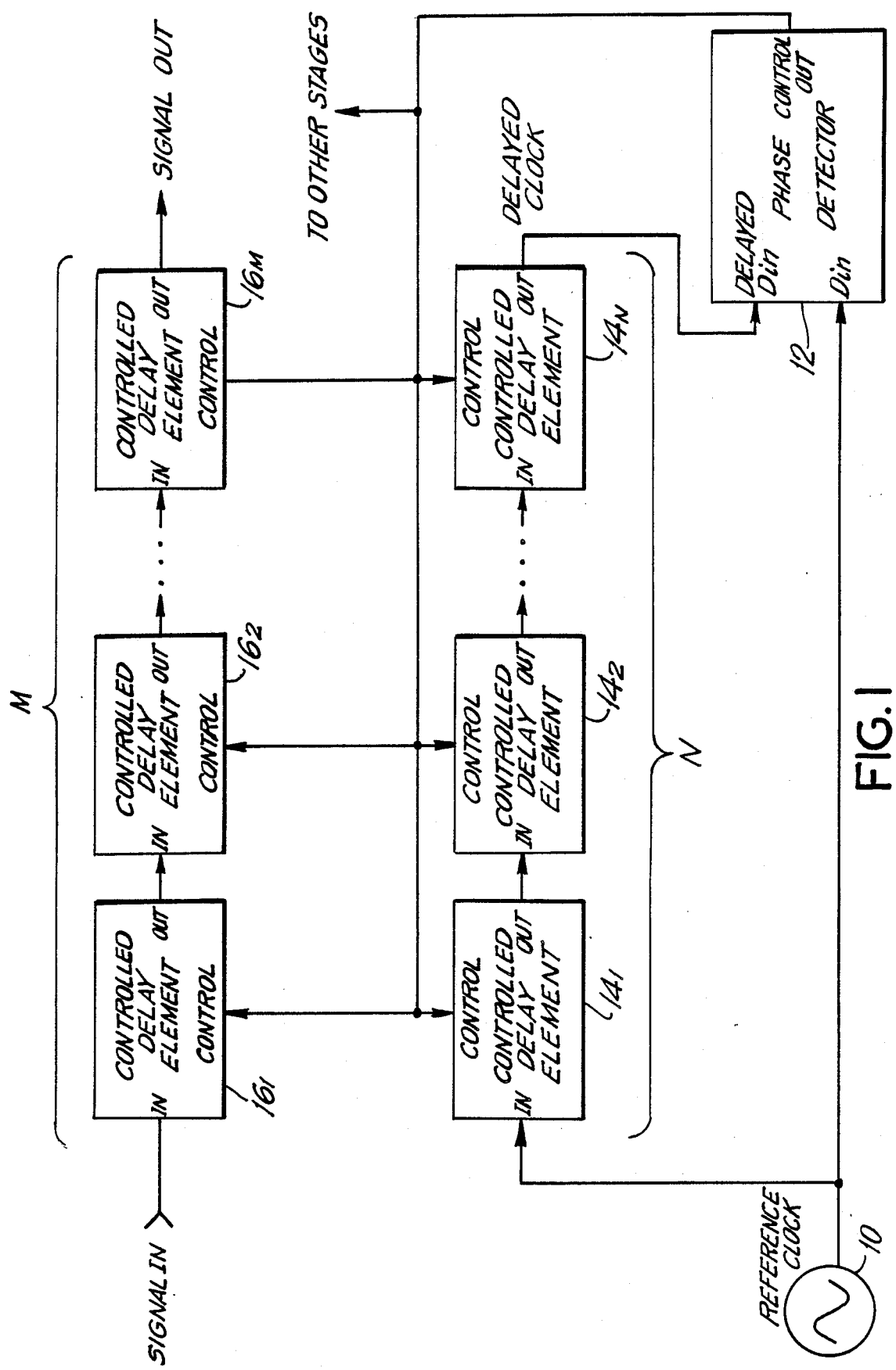
FIG. 1 is a schematic block diagram of a digital delay line in accordance with one embodiment of the present invention.

FIG. 1 illustrates an embodiment of the present invention in schematic form, which includes a reference clock 10 having a known and accurately controlled frequency, e.g., 2.0 mHz. The output of reference clock 10 is applied to one input of a phase detector 12 and to an input of a voltage controlled delay element $14_1$, the output of which is applied to an input of a second voltage controlled delay element $14_2$. A plurality N of such voltage controlled delay elements, the last being designated $14_N$, are connected in series or cascade with the output of the preceding element being applied to the input of the immediately succeeding delay element. The output of the last of the N voltage controlled delay elements, which is a delayed clock signal, is applied to a second or delayed input of phase detector 12.

As described in greater detail in a following section of this specification, each of the voltage controlled delay elements 14 includes a plurality of series-connected buffers that introduce a delay between its input and output. That delay is variable and is controlled by the level of the control signal that is applied to the control input terminal of the delay element. The delay introduced to the input digital signal by the delay element between its input to its output is inversely proportional to the control voltage applied to its control input.

Figure 2:
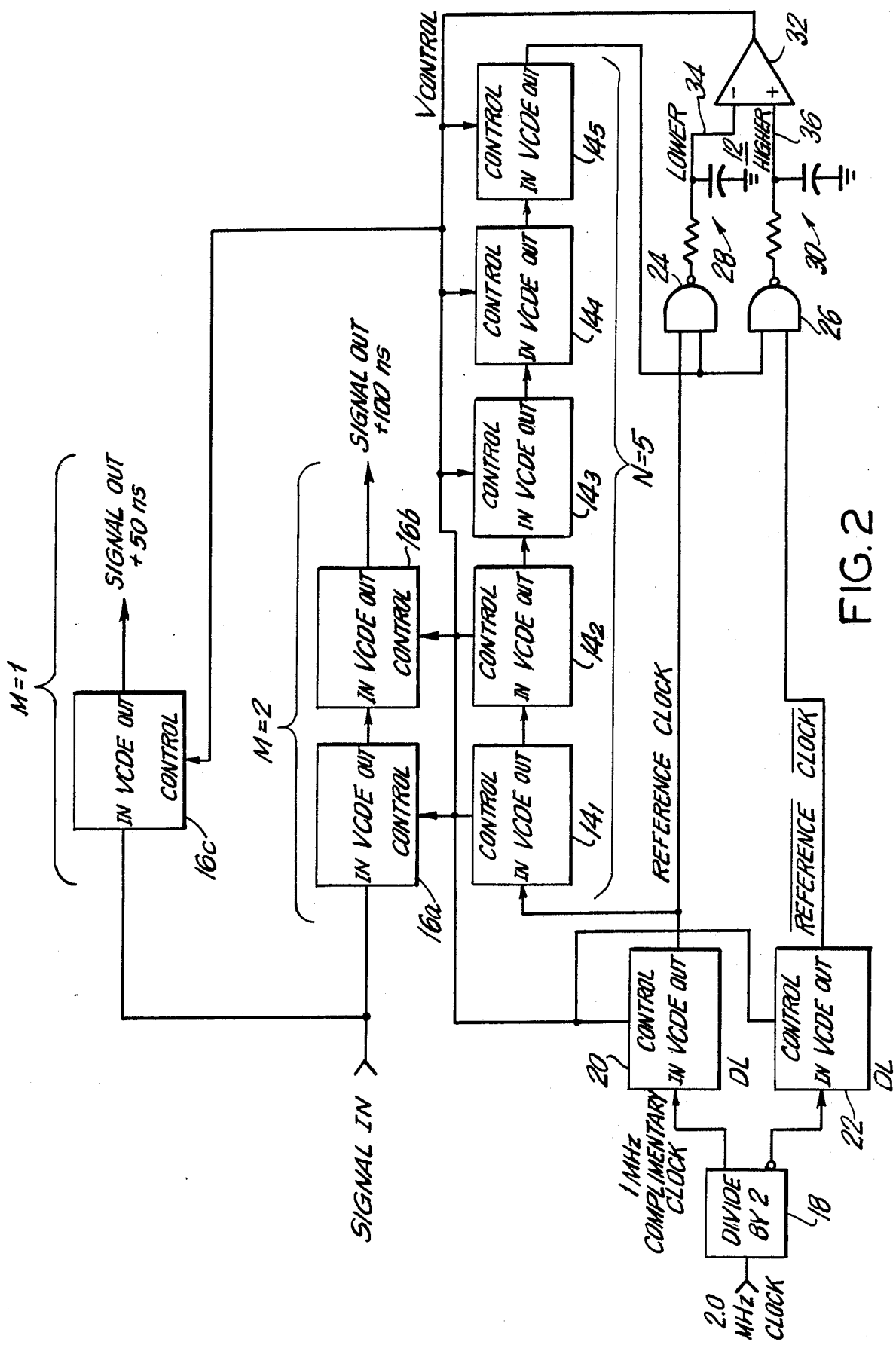
FIG. 2 is a more detailed block diagram of the delay line of FIG. 1.

Referring again to FIG. 1, the input signal to which a delay is to be introduced is applied to the input of a voltage controlled delay element $16_1$, the output of which is applied to an additional voltage controlled delay element $16_2$. Delay elements $16_1$ and $16_2$ are connected to form a second array of a plurality M of series-connected voltage controlled delay elements $16_1$ and $16_M$. The output of the final element $16_M$ in this series-connected array is an output signal which is delayed from the input, Signal In, by a controlled, predetermined time. The individual delay elements 14, 16 in the delay line of FIG. 1, as well as that in FIG. 2, are substantially identical to one another.

The control signal applied to the control input of the controlled delay elements 14, 16 to control the delays is observed at the output of phase detector 12, which senses the phase delay between the clock signal delayed in delay elements $14_1$–$14_N$ and the undelayed reference clock signal. If the phase between the delayed clock and undelayed reference clock is below a preset amount the level of the control voltage at the output of phase detector 12 is changed so as to increase the delay in each of the controlled delay elements 14 and 16. Conversely, if the phase delay between the delayed clock and reference clock is greater than a preset amount, the level of the control signal is changed to decrease the delay in each of the voltage controlled delay elements 14, 16. Since, as noted, the voltage controlled delay elements 14, 16 are substantially identical, the delay through each of these elements is also identical when the same control signal is applied to each.

In the circuit of FIG. 1, the delay through each controlled delay element 14, 16 is:

$$\text{Element Delay} = \frac{\text{phase angle}°}{360° \times f_{refclock} \times N} \quad (1)$$

The delay from Signal In to Signal Out is: (2)

$$\text{Signal Delay} = M \times \text{Element Delay} = \frac{M \times \text{phase angle}°}{360° \times f_{refclock} \times N}$$

In the above Equations (1) and (2), the phase angle is that at which the phase detector 12 triggers. From a consideration of Equations (1) and (2), it can be seen that it is possible to derive a signal delay that is any integral multiple and/or division of the reference clock frequency by the use of an integral number of controlled delay elements 14, 16 in the series-connected lines or stages N and M, respectively. If desired, additional signal delay lines or stages of series-connected voltage controlled delay elements, with a different number M of elements in each stage, may be operated by the control signal produced by the phase detector 12, so as to provide different integral multiples of the individual element delay times, as indicated in FIG. 1.

A practical implementation of the circuit of FIG. 1 is illustrated in FIG. 2 for purposes of example and explanation. In the circuit of FIG. 2, the 2.0 mHz input reference clock is passed though a divide-by-two circuit 18 to provide a signal at a frequency of 1.0 mHz and having a 50 percent duty cycle reference clock that is needed for the phase detector. One of the outputs of circuit 18 is inverted to provide a true and complementary reference clock signal, which are respectively applied to the inputs of voltage-controlled delay elements 20 and 22. The reference clock and its complement are applied through a low-pass filter comprising NAND gates 24 and 26 and RC circuits 28 and 30, respectively. The RC networks 28 and 30 are respectively connected to the positive and negative inputs of a comparator or differential amplifier 32 via a Higher line 34 and a Lower line 36.

The delay circuit of FIG. 2 includes five voltage-controlled delay elements $14_1$ to $14_5$, the first of which receives the reference clock at its input from the output of delay element 20. The output of the last of series-connected elements 14, is applied to the remaining inputs of NAND gates 24 and 26. In the circuit of FIG. 2, the factor N in equation (1) and (2) is 5.

The input signal to the circuit, Signal In is applied to a first series-connected two-element stage consisting of voltage controlled elements 16a and 16b, as well as to a second delay stage consisting of a single voltage controlled delay element 16c. Each of the voltage-controlled delay elements 14, 16, 20, 22, 24, and 26 receive the control voltage output from the phase detector 12 at its respective control input. The circuit of FIG. 2 has two delay stages in which M is equal to 1 and 2.

The circuit of FIG. 2 uses a 90° phase shift detection and a voltage control that is inversely proportional to delay. With reference to Equation (1) above, with N=5, phase angle=90°, and f clock=1 mHz, the element delay is 50 ns. Thus, the delay stage in which N=1 provides a signal delay of 50 ns, whereas the delay stage in which M=2 provides a signal delay of 100 ns.

As noted previously, the phase detection is low-pass filtered by means of the RC networks 28 and 30 at the output of the NAND gates 24 and 26, respectively. When the average voltages on lines 34 and 36 are nearly equal, the circuit is stable. As the delay through the N delay elements 14 is less than 250 ns, the duty cycle on line 34 will increase, and the control voltage control of the output of comparator 32 will decrease, thereby increasing the delay in each of the voltage-controlled delay elements. Conversely, if the delay in the N delay elements increases, the level of the control voltage will increase, thereby decreasing the delay provided by the delay elements.

Figure 3:
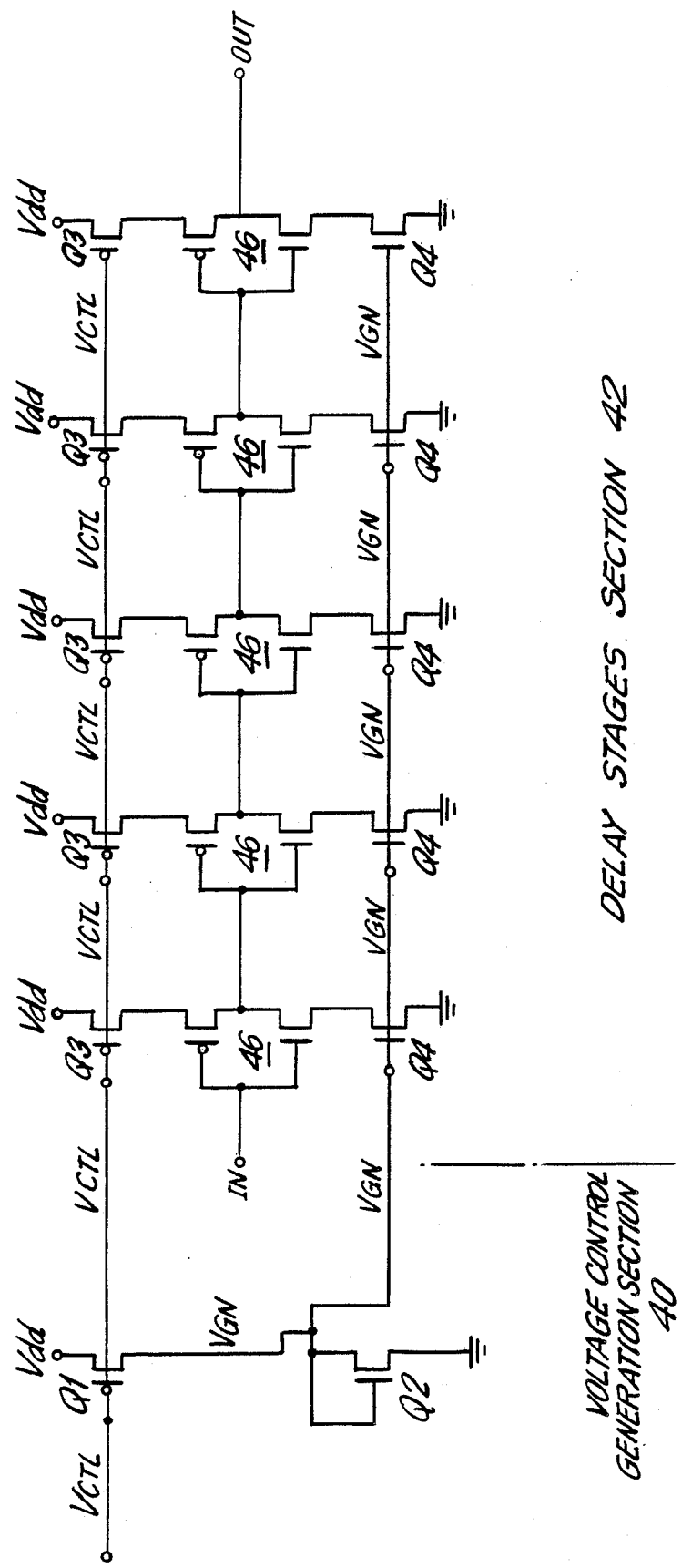
FIG. 3 is a schematic diagram of one of the controlled delay elements of the delay line of FIGS. 1 and 2.

FIG. 3 illustrates a circuit that has been found to be advantageous for use as a voltage-controlled delay element 14, 16 in the delay circuits of FIGS. 1 and 2. The circuit shown in FIG. 3 is a CMOS digital delay element which, in addition to its use a delay line, as in FIGS. 1 and 2, can also be used to advantage in place of conventional inverter string delays and selected tap point delay circuits. The circuit of FIG. 3 has a particular advantage over inverter strings since the latter require a control voltage source that is high-current and very well regulated. Moreover, in the conventional inverter string, when the control voltage is reduced, the output voltage trip level is also lowered. This distorts the duty cycle of the output and creates level shifting difficulties when the circuit is interfaced with other circuits. The input switch level is similarly adversely affected. In the circuit of FIG. 3, these drawbacks are avoided primarily because the control voltage does not directly power any buffer. In addition, in the circuit of FIG. 3, the output voltage is at full supply levels and the input trip levels are at the center of the supply levels regardless of the level of the control voltage.

Referring now to FIG. 3, the digital delay element therein schematically illustrated includes a control voltage generation stage 40, and a series of delay stages 42. The control voltage CTL is applied to the gate of a P-type MOS device Q1, whose source is connected to the drain and to the gate of an N-type MOS device Q2 by a VGN line. The drain of device Q1 is connected to Vdd whereas the source of device Q2 is connected to ground. Devices Q1 and Q2 constitute a current mirror which provides the same currents to the P-type and N-type current limiting devices Q3 and Q4 in the delay stages that follow so as to avoid distortion of the edge. To that end, the ratio of the sizes of the P-type and N-type devices in the current mirror in control voltage generation stage 40 must be the same as the size ratios of the P and N devices in the delay stages 42.

The delay stage section 42 consists of a series of CMOS inverters 46 in series connection with the current limiting devices Q3 and Q4 between Vdd and ground. The initial inverter stage receives the input signal IN at its gate and the output of each inverter is applied to the gate of the succeeding inverter. The gates of the P-type and N-type current-limiting devices Q3 and Q4 are controlled respectively by the VGP and VGN control voltages from control section 40.

In the operation of the circuit of FIG. 3, a voltage is applied to VGP. Lower voltages allow the P-type current limiting devices in the delay stage and voltage generation sections Q1, Q3 to deliver more current. This current limit is mirrored onto the VGN line via the voltage generation section. This causes the N-type devices Q2, Q4 to limit the current to ground in the same amount as the P-type devices $Q_1$, $Q_3$ limit the current to Vdd. This symmetry reduces duty cycle distortion and keeps the voltage trip point of each delay stage at the same point as for other logic with the same ratio between the P and N-type devices. The rise and fall times are determined by the current delivered by the limiting devices into the nodal capacitance being driven (the on resistance of the signal devices in each stage also contributes to the delay to a varying degree). Minimum and maximum input switching times and delay error tolerance will determine the sizes of the delay line devices. The delay required along with specific characteristics of the process will determine the number of delay stages needed.

It will be appreciated that the present invention provides an improved digital delay line. It will be also appreciated that modifications may be made to the embodiments of the invention specifically described hereinabove without necessarily departing from the spirit and scope of the invention.

What is claimed is:

1. A digital delay circuit comprising a first and a second array of an integral number N and M of series-connected controllable delay elements, respectfully, each of said delay elements being characterized in that the delay established between its input and output is controlled by a control signal applied to a control input thereat, a source of a reference clock, means for delaying said reference clock through one of said first and second arrays of delay elements, thereby to establish a delayed reference clock, means coupled to said clock source and to said first array of delay elements for comparing said reference clock and said delayed reference clock to produce a control signal representative of the comparison between said reference clock and said delayed reference clock, and means for applying said control signal to the control input of each of said controllable delay elements, thereby to vary the delay introduced by each of said delay elements to an input signal.

2. The digital delay circuit of claim 1, in which each of said delay elements comprises an input voltage control section receiving the control signal and producing first and second control voltages, a plurality of series-connected CMOS inverters the input of the first of said inverters receiving an input signal.

3. The digital delay circuit of claim 2, in which each of said inverters is connected in series with complementary first and second MOS control devices between a voltage source and a reference potential, the gates of said first and second MOS control devices respectively receiving said first and second control voltages.

4. The digital delay circuit of claim 1, further comprising means for deriving the true and complement of the clock signal, and gating means interposed intermediate said clock deriving means and said comparing means for respectively receiving one of the true and complement clock signals and said delayed reference clock.

* * * * *